US011212457B2

(12) United States Patent
Dai et al.

(10) Patent No.: US 11,212,457 B2
(45) Date of Patent: Dec. 28, 2021

(54) HIGH DYNAMIC RANGE CMOS IMAGE SENSOR DESIGN

(71) Applicant: OMNIVISION TECHNOLOGIES, INC., Santa Clara, CA (US)

(72) Inventors: Tiejun Dai, Santa Clara, CA (US); Keiji Mabuchi, Los Altos, CA (US); Zhe Gao, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 56 days.

(21) Appl. No.: 16/886,473

(22) Filed: May 28, 2020

(65) Prior Publication Data
US 2021/0377435 A1     Dec. 2, 2021

(51) Int. Cl.
| | |
|---|---|
| *H04N 5/235* | (2006.01) |
| *H01L 27/146* | (2006.01) |
| *H04N 5/345* | (2011.01) |
| *H01L 27/092* | (2006.01) |
| *H04N 5/378* | (2011.01) |

(52) U.S. Cl.
CPC ....... *H04N 5/2355* (2013.01); *H01L 27/0922* (2013.01); *H01L 27/14612* (2013.01); *H04N 5/345* (2013.01); *H04N 5/378* (2013.01)

(58) Field of Classification Search
CPC .............. H04N 5/2355; H04N 5/345; H01L 27/14612; H01L 27/0922; H01L 27/146–14656; H01L 2225/06503–06596; G02B 5/20–289; G02B 5/22–24; G02B 5/205

See application file for complete search history.

(56) References Cited

U.S. PATENT DOCUMENTS

| | | | |
|---|---|---|---|
| 2013/0049082 A1* | 2/2013 | Kato | H01L 27/14641 257/292 |
| 2014/0239152 A1* | 8/2014 | Chen | H01L 27/14612 250/208.1 |
| 2016/0071892 A1* | 3/2016 | Chen | H01L 27/14689 257/225 |
| 2017/0347047 A1* | 11/2017 | Mao | H04N 5/23229 |
| 2018/0366513 A1* | 12/2018 | Yang | H04N 5/37452 |

* cited by examiner

*Primary Examiner* — Abdelaaziz Tissire
(74) *Attorney, Agent, or Firm* — Christensen O'Connor Johnson Kindness PLLC

(57) ABSTRACT

A pixel cell includes a first subpixel and a plurality of second subpixels. Each subpixel includes a photodiode to photogenerate image charge in response to incident light. Image charge is transferred from the first subpixel to a floating diffusion through a first transfer transistor. Image charge is transferred from the plurality of second subpixels to the floating diffusion through a plurality of second transfer transistors. An attenuation layer is disposed over the first subpixel. The first subpixel receives the incident light through the attenuation layer. The plurality of second subpixels receive the incident light without passing through the attenuation layer. A dual floating diffusion (DFD) transistor is coupled to the floating diffusion. A capacitor is coupled to the DFD transistor.

35 Claims, 4 Drawing Sheets

HIGH DYNAMIC RANGE CMOS IMAGE SENSOR DESIGN

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog signals from the column bitlines and converted to digital values to produce digital images (i.e., image data) representing the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
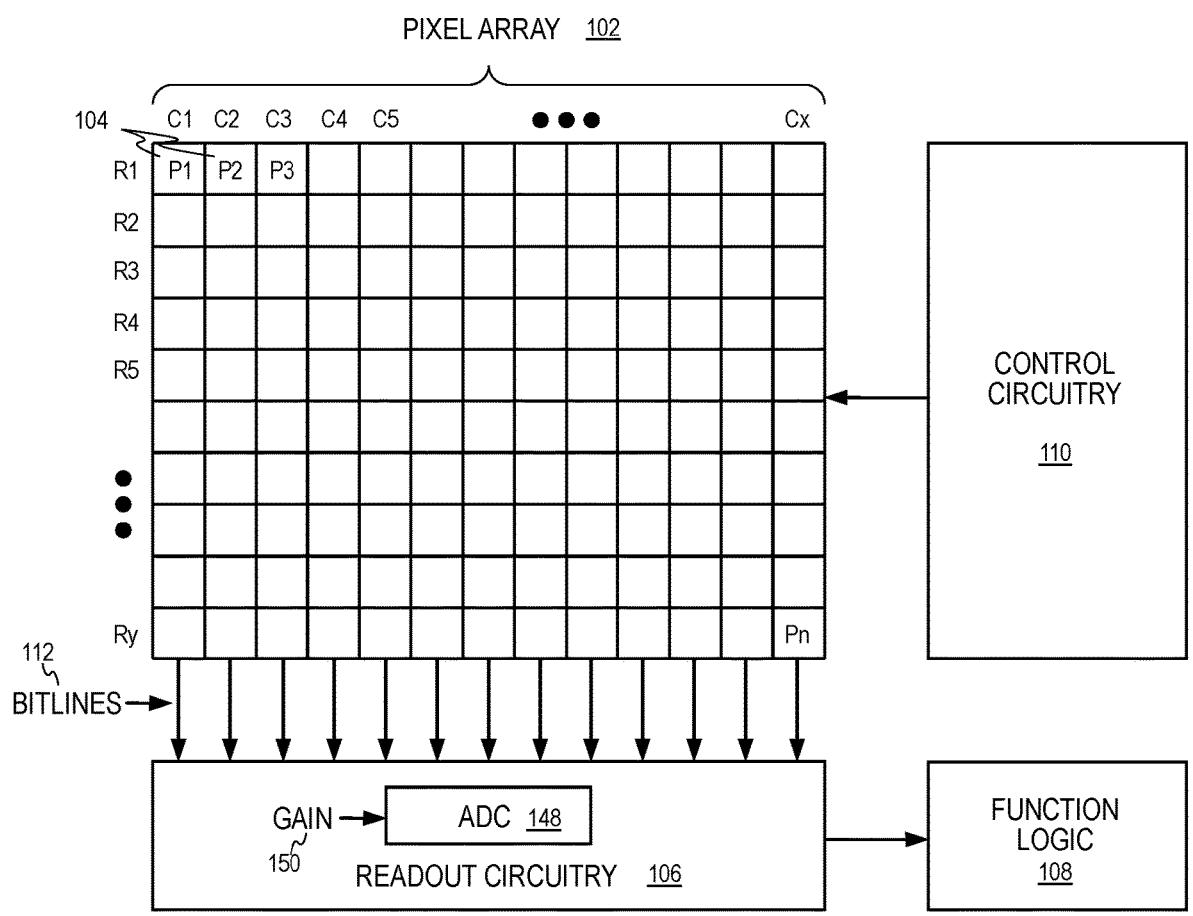
FIG. 1 illustrates one example of an imaging system including a pixel array with a high dynamic range shared pixel CMOS image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a pixel array with a high dynamic range (HDR) shared pixel CMOS image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a pixel array with an HDR shared pixel CMOS image sensor are described. In various examples, the HDR shared pixel cell structures of the CMOS image sensors described herein include a plurality of subpixels that include a first subpixel configured as a small photodiode (SPD) to sense light in medium to higher intensity lighting conditions, a plurality of second subpixels that are configured as a large photodiode (LPD) to sense light in dimmer or medium intensity lighting conditions, as well as a lateral overflow integration capacitor (LOFIC) design to sense light in bright light conditions to realize HDR imaging in accordance with the teachings of the present invention.

In the various examples, it is appreciated that the example shared pixels utilize small pixels (e.g., 2.1 µm) that may be arranged for instance in a 1.05 µm 2×2 shared pixel design. In various examples, high dynamic range is provided with a LOFIC pixel design combined with attenuation over the SPD to provide LED flicker mitigation (LFM) capabilities. In various examples, single exposure captures (e.g., SPD/LPD exposures of ~11 ms) can provide image acquisition with limited motion artifacts. In the various examples, multiple exposure captures (e.g., SPD exposures of ~11 ms and LPD exposures of ~33 ms) can provide captures having good mid-range image performance with a mid-range signal to noise ratio (SNR) in accordance with the teachings of the present invention.

To illustrate, FIG. 1 shows one example of an imaging system 100 including a pixel array with an HDR shared pixel CMOS image sensor in accordance with the teachings of the present invention. In the example, the imaging system 100 includes a pixel array 102, control circuitry 110, readout circuitry 106, and function logic 108. In one example, pixel array 102 is a two-dimensional (2D) array including a plurality of pixel cells 104 (e.g., P1, P2, Pn) that are arranged into rows (e.g., R1 to Ry) and columns (e.g., C1 to Cx) to acquire image data of a person, place, object, etc., which can then be used to render an image of a person, place, object, etc.

As will discussed in greater detail below, in one example, each pixel cell 104 is configured as a shared pixel HDR pixel cell with a plurality of subpixels including a first subpixel configured as a small photodiode (SPD) and a plurality of second subpixels configured as a large photodiode (LPD) to photogenerate image charge in response to incident light. A lateral overflow integration capacitor (LOFIC) with low leakage is also included, which further expands the dynamic range of the pixel cell. In addition, light attenuating filters (which may also be referred to as neutral density (ND) filters or ND optical attenuators) having attenuation ratios in the range of 3:1 to 32:1 (i.e., 3-32×) are disposed over the SPD subpixel, which mitigate LED flickering. In one example, ND filters having an attenuation ratio of 5:1 (i.e., 5×), or in the range of 5:1 to 10:1 (i.e., 5-10×) are utilized in the pixel cells 104 to provide good mid-range image sensor performance with an SNR>25 dB.

After each pixel cell 104 has acquired its image charge, the corresponding analog image charge data signals are read out by readout circuitry 106 through column bitlines 112 by readout circuitry 106. In the various examples, the analog image charge signals are converted to digital values with an analog-to-digital converter (ADC) 148 included in the readout circuitry 106. In one example, the ADC 148 has adjustable gain 150, which enables the image data to be read out from the pixel array 102 with multiple gain settings in accordance with teachings of the present invention. The digital representations of the image data may then be transferred to function logic 106. In various examples, readout circuitry 106 may also include amplification circuitry, column readout circuitry, or otherwise. Function logic 108 may simply store the image data or even manipulate the image data by applying post image effects (e.g., crop, rotate, remove red eye, adjust brightness, adjust contrast, or otherwise). In one example, readout circuitry 106 may read out one row of image data at a time along column bitlines 112 (illustrated) or may read out the image data using a variety of other techniques (not illustrated), such as a serial read out or a full parallel read out of all pixel cells 104 simultaneously.

In one example, control circuitry 110 is coupled to pixel array 102 to control operational characteristics of pixel array 102. For instance, in one example, control circuitry 110 generates the transfer gate signals and other control signals to control the transfer and readout of image data from all of the subpixels of each shared pixel cell 104 of pixel array 102. In addition, control circuitry 110 may generate a shutter signal for controlling image acquisition. In one example, the shutter signal is a global shutter signal for simultaneously enabling all pixel cells 104 within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2:
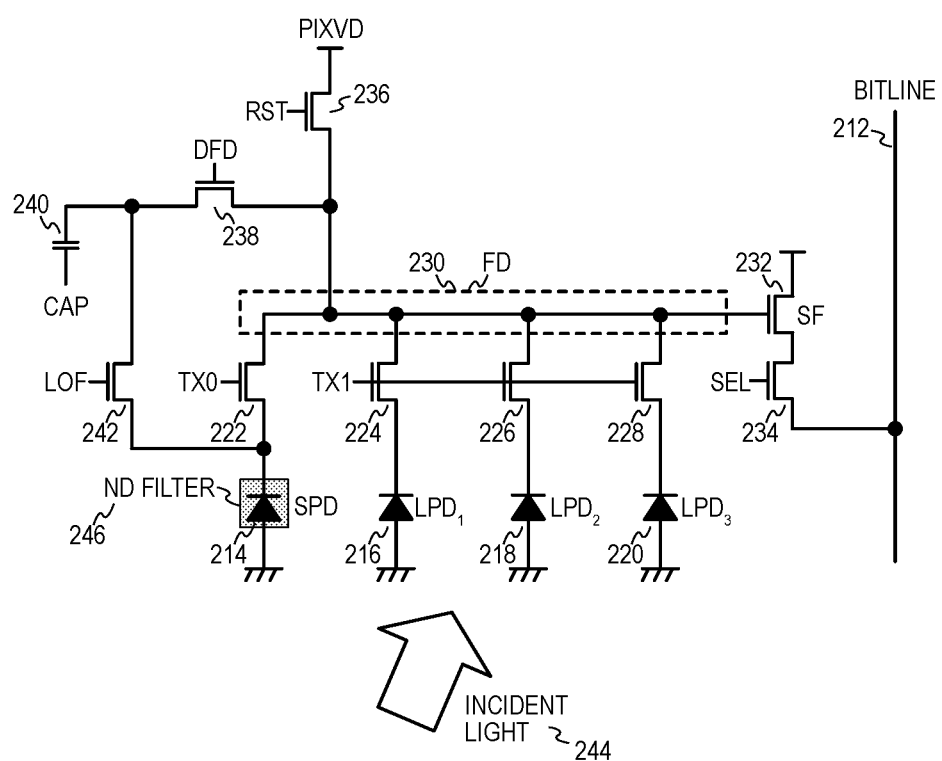
FIG. 2 illustrates one example schematic of a shared pixel cell of a CMOS image sensor in accordance with the teachings of the present disclosure.

FIG. 2 illustrates one example schematic of an example shared pixel cell 204 of a pixel array of an HDR CMOS image sensor with low color crosstalk in accordance with the teachings of the present disclosure. It is appreciated the example schematic of pixel cell 204 of FIG. 2 may be one example of one of the pixel cells 104 of the pixel array 102 as shown in FIG. 1, and that similarly named and numbered elements described above are coupled and function similarly below.

As shown in the depicted example, shared pixel cell 204 includes a plurality of subpixel, each of which includes a photodiode coupled to photogenerate image charge in response to incident light 244. In the example, the plurality of subpixels include a first subpixel, which is configured as a small photodiode (SPD) 214, and a plurality of second subpixels, which are configured as a large photodiode (LPD) including $LPD_1$ 216, $LPD_2$ 218, and $LPD_3$ 220 as shown. In the depicted example, pixel cell 204 also includes a floating diffusion FD 230 coupled to receive the image charge from the plurality of subpixels SPD 214, $LPD_1$ 216, $LPD_2$ 218, and $LPD_3$ 220.

The example depicted in FIG. 2 also shows a plurality of transfer transistors including a first transfer transistor 222, and a plurality of second transistors, which include transfer transistor 224, transfer transistor 226, and transfer transistor 228. In operation, the photogenerated image charge is coupled to be transferred from the first subpixel SPD 214 to the floating diffusion FD 230 through the first transfer transistor 222. The photogenerated image charge is coupled to be transferred from the plurality of second subpixels $LPD_1$ 216, $LPD_2$ 218, and $LPD_3$ 220 to the floating diffusion FD 230 through the plurality of second transfer transistors 224, 226, and 228, respectively. In the example depicted in FIG. 2, transfer transistor 222 is coupled to be controlled in response to transfer control signal TX0, and transfer transistors 224, 226, and 226 are all coupled to be controlled in response to transfer control signal TX1 as shown.

In one example, pixel cell 204 also includes an attenuation layer 246 disposed over the first subpixel SPD 214. In one example, attenuation layer 246 is a neutral density (ND) filter with an attenuation ratio in the range of 3:1 to 32:1 (i.e., 3-32×). For instance, in one example, the attenuation layer 246 has an attenuation ratio of 5:1 (i.e., 5×), or in the range of 5:1 to 10:1 (i.e., 5-10×). In operation, the first subpixel SPD 214 is optically coupled to receive the incident light 244 through the attenuation layer 246. In the example, the plurality of second subpixels $LPD_1$ 216, $LPD_2$ 218, and $LPD_3$ 220 are not covered by attenuation layer 246 and are therefore optically coupled to receive the incident light 244 without passing through the attenuation layer 246.

In the example illustrated in FIG. 2, a dual floating diffusion (DFD) transistor 238 is coupled to the floating diffusion FD 230, and a capacitor 240 is coupled to the DFD transistor 238 as shown. In one example, the capacitor 240 is a lateral overflow integration capacitor (LOFIC), which is coupled to receive a CAP signal as shown. In one example, the LOFIC 240 is a high density capacitor that utilizes for instance a three dimensional metal-insulator-metal (MIM) design, which provides a large LOFIC. For instance, in one example, LOFIC 240 has a capacitance of 64 fF. In one example, a LOFIC transistor 242 is coupled between the LOFIC 240 and the first subpixel SPD 214 as shown. In the example, the LOFIC transistor 242 is coupled to be controlled in response to an LOF signal.

The illustrated example shows that pixel cell 204 also includes a source follower transistor 232 coupled to a voltage supply and includes a gate electrode that is coupled to the floating diffusion FD 230. A select transistor 234 is coupled to the source follower transistor 232 and a bitline 212, and is coupled to be controlled in response to a select signal SEL. In operation, the source follower transistor 232 is coupled to output an image data signal to the bitline 212 through select transistor 234 in response to the image charge in the floating diffusion FD 230. A reset transistor 236 is coupled between the voltage supply PIXVD and the floating diffusion FD 230 and is coupled to reset the pixel cell 204 in response to a reset control signal RST. In operation, reset transistor 236 may be configured to reset the floating diffusion FD 230, as well as reset the LOFIC 240 through the DFD transistor 238.

Figure 3A:
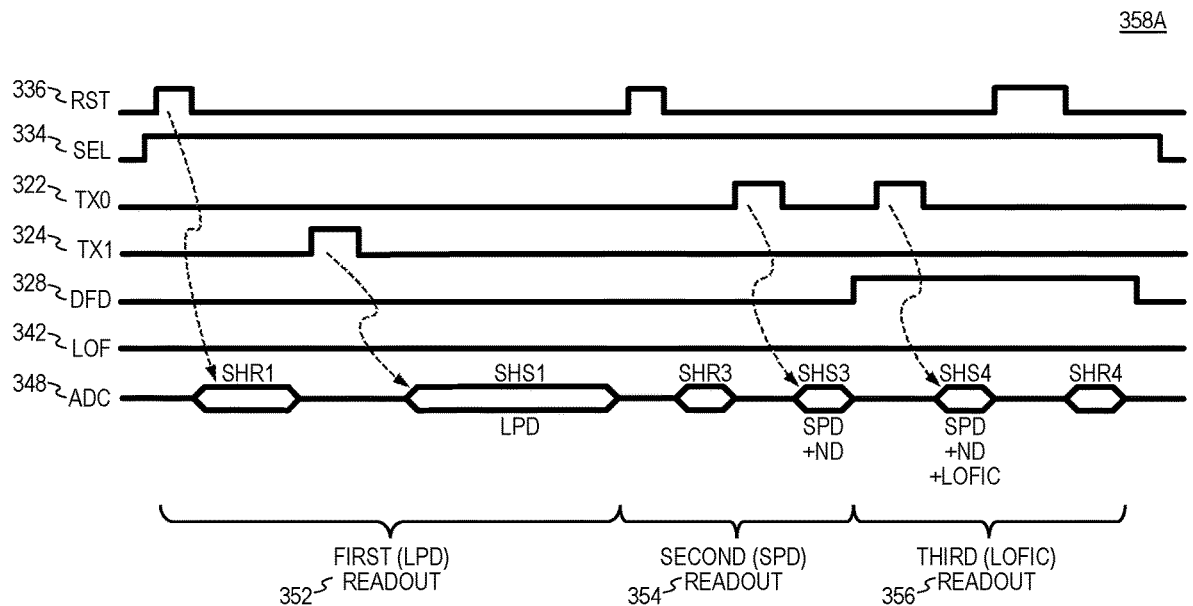
FIG. 3A illustrates an example timing diagram of signals found in an example shared pixel cell of a CMOS image sensor during readout in accordance with the teachings of the present disclosure.

FIG. 3A illustrates an example timing diagram 358A of signals found in an example shared pixel cell of a CMOS image sensor during readout in accordance with the teachings of the present disclosure. It is appreciated the signals illustrated in example timing diagram 358A of FIG. 3A may be examples of signals found in the schematic of pixel cell 204 of FIG. 2 or of signals found in the pixel cells 104 of the pixel array 102 as shown in FIG. 1, and that similarly named and numbered elements described above are coupled and function similarly below.

As illustrated in the depicted example, the readout of the pixel cell includes three readout operations 352, 354, and 356. In one example, the image data signal of the LPD of the pixel cell is read out with a first readout 352, the image data signal of the SPD of the pixel cell is read out with a second readout 354, and the image data signal of the LOFIC combined with the SPD is read out with a third readout 356. In the example, the first readout 352 of the image data signal from the LPD includes image data in the incident light at a lower illumination intensity range, the second readout 354 of the image data signal from the SPD includes image data in the incident light at a medium illumination intensity range, and the third readout 356 of the image data signal from the LOFIC and the SPD includes image data in the incident light at a higher illumination intensity range.

Referring specifically to the first readout 352 in FIG. 3A, the select signal SEL 334 is activated and the reset signal RST 336 is pulsed. At this time, the floating diffusion FD of the pixel cell is reset. Next, the ADC 348 signal indicates that a first reset value of the first readout 352 is sampled and held from the floating diffusion FD through the bitline as indicated with the "SHR1" label in ADC signal 348. It is noted that in various examples, all of the SHR (sample and hold reset) and SHS (sample and hold signal) values may be digitally stored after the analog-to-digital conversion indicated in the ADC 348 signal.

Continuing with the first readout 352 in FIG. 3A, the first readout 352 further includes the image charge in the $LPD_1$, $LPD_2$, and $LPD_3$ subpixels being configured to be transferred to the floating diffusion FD through the second transfer transistors, as indicated with the pulsing of the TX1 324 signal. Next, the ADC 348 signal indicates that a first image data signal value of the first readout 352 is configured to be sampled and held from the floating diffusion FD through the bitline as indicated with the "SHS1" label in ADC signal 348. At this time, a correlated double sampling (CDS) value of the LPD readout from the first readout 352 can be obtained by determining a difference between the first image data signal value (e.g., "SHS1") of the first readout 352 and the first reset value (e.g., "SHR1") of the first readout 352.

Referring specifically to the second readout 354 in FIG. 3A, the reset signal RST 336 is pulsed again such that the floating diffusion FD of the pixel cell is reset. Next, the ADC 348 signal indicates that a reset value of the second readout 354 is sampled and held from the floating diffusion FD through the bitline as indicated with the "SHR3" label in ADC signal 348.

Continuing with the second readout 354 in FIG. 3A, the second readout 354 further includes the image charge in the SPD subpixel being configured to be transferred to the floating diffusion FD through the first transfer transistor, as indicated with the pulsing of the TX0 signal 322. Next, an image data signal value of the second readout 354 is configured to be sampled and held from the floating diffusion FD through the bitline as indicated with the "SHS3" label in ADC signal 348. At this time, the CDS value of the second readout 354 is a difference between the image data signal value ("SHS3") of the second readout 354 and the reset value ("SHR3") of the second readout 354.

Referring specifically to the third readout 356 in FIG. 3A, the image charge in the SPD subpixel is further configured to be transferred to the LOFIC and the floating diffusion FD through the DFD transistor and the first transfer transistor as indicated with the DFD signal 328 being enabled and the TX0 signal 322 being pulsed again as shown. Next, an image data signal value of the third readout 356 is configured to be sampled and held from the floating diffusion FD and the LOFIC through the bitline as indicated with the "SHS4" label in ADC signal 348.

Continuing with the third readout 356 in FIG. 3A, the reset signal RST 336 is pulsed again while the DFD signal 328 is still enabled such that the floating diffusion FD and the LOFIC of the pixel cell are reset. Next, the ADC 348 signal indicates that a reset value of the third readout 356 is configured to be sampled and held from the floating diffusion FD and the LOFIC through the bitline as indicated with the "SHR4" label in ADC signal 348. At this time, the CDS value of the third readout 356 is a difference between the image data signal value ("SHS4") of the third readout 356 and the reset value ("SHR4") of the third readout 356.

Figure 3B:
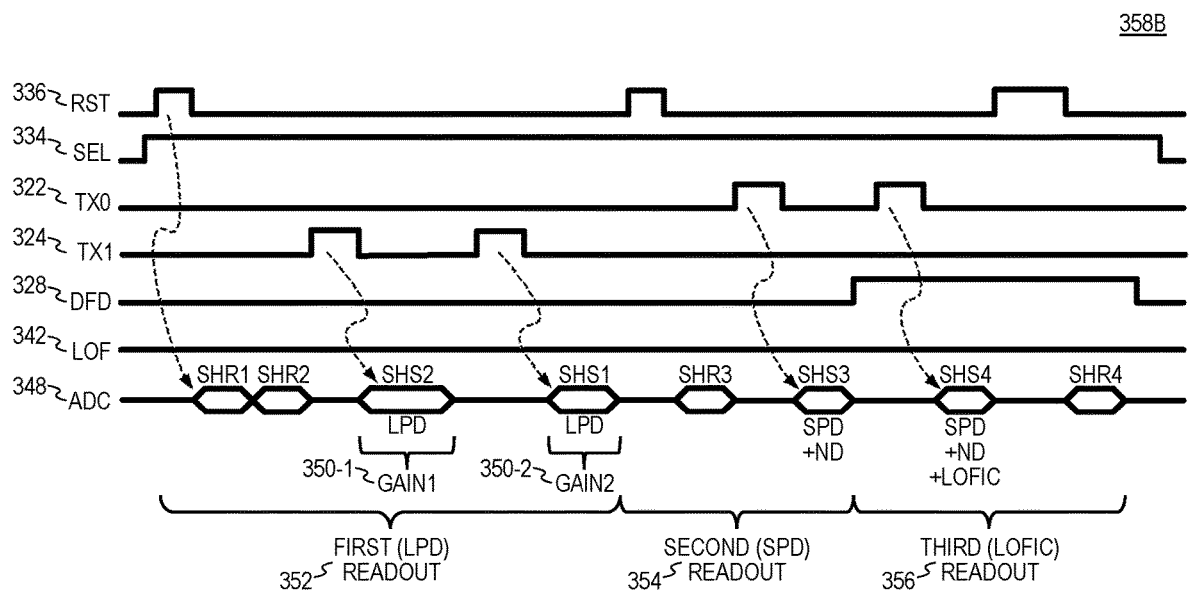
FIG. 3B illustrates another example timing diagram of signals found in an example shared pixel cell of a CMOS image sensor during readout in accordance with the teachings of the present disclosure.

FIG. 3B illustrates another example timing diagram 358B of signals found in an example shared pixel cell of a CMOS image sensor during readout in accordance with the teachings of the present disclosure. It is appreciated the signals illustrated in example timing diagram 358B of FIG. 3B may be examples of signals found in the schematic of pixel cell 204 of FIG. 2 or of signals found in the pixel cells 104 of the pixel array 102 as shown in FIG. 1, and that similarly named and numbered elements described above are coupled and function similarly below.

It is further appreciated that timing diagram 358B of FIG. 3B shares many similarities with timing diagram 358A of FIG. 3A. One difference between timing diagram 358B of FIG. 3B and timing diagram 358A of FIG. 3A is that the first readout 352 in timing diagram 358B of FIG. 3B includes two different gain readouts 350-1 and 350-2 as shown. In one example, the different gain readouts 350-1 and 350-1 are achieved with the ADC (e.g., ADC 148 of FIG. 1) coupled to the bitline being adjusted to have different gain settings for the two different gain readouts 350-1 and 350-2. It is appreciated that the different gain settings of the two different gain readouts 350-1 and 350-2 may be interchangeable in various examples.

Referring specifically to the first readout 352 of the example timing diagram 358B of FIG. 3B, the select signal SEL 334 is activated and the reset signal RST 336 is pulsed. At this time the floating diffusion FD of the pixel cell is reset. Next, two reset values are sampled and held. In particular, ADC 348 signal indicates that a first reset value of the first readout 352 is sampled and held from the floating diffusion FD through the bitline as indicated with the "SHR1" label in ADC signal 348, and a second reset value of the first readout 352 is sampled and held from the floating diffusion FD through the bitline as indicated with the "SHR2" label in ADC signal 348.

Continuing with the first readout 352 in FIG. 3B, the first gain readout 350-1 of the first readout 352 includes the image charge in the $LPD_1$, $LPD_2$, and $LPD_3$ subpixels being configured to be transferred to the floating diffusion FD through the second transfer transistors, as indicated with the pulsing of the TX1 324 signal. Next, the ADC 348 signal indicates that an image data signal value of the first gain readout 350-1 is configured to be sampled and held from the floating diffusion FD through the bitline at a first gain setting (e.g., "GAIN1") by the ADC that is coupled to the bitline. At this time, the CDS value of the first gain readout 350-1 of the LPD readout of the first readout 352 is a difference between the image data signal value of the first gain readout (e.g., "SHS2") and one of the two reset values (e.g., "SHR2") of the of the first readout 352.

Next, a second gain readout 350-2 of the first readout 352 includes the image charge in the $LPD_1$, $LPD_2$, and $LPD_3$ subpixels being configured to be transferred to the floating diffusion FD again through the second transfer transistors, as indicated with the pulsing of the TX1 324 signal again. Next, the ADC 348 signal indicates that an image data signal value of the second gain readout 350-2 is configured to be sampled and held from the floating diffusion FD through the bitline at a second gain setting (e.g., "GAIN2") by the ADC that is coupled to the bitline. At this time, the CDS value of the second gain readout 350-2 of the LPD readout of the second readout 352 is a difference between the image data signal value of the second gain readout (e.g., "SHS1") and the other one of the two reset values (e.g., "SHR1") of the of the second readout 352.

It is appreciated that the second readout 354 in FIG. 3B is substantially similar to the second readout 354 in FIG. 3A. For instance, referring specifically to the second readout 354 in FIG. 3B, the reset signal RST 336 is pulsed again such that the floating diffusion FD of the pixel cell is reset. Next, the ADC 348 signal indicates that a reset value of the second readout 354 is sampled and held from the floating diffusion FD through the bitline as indicated with the "SHR3" label in ADC signal 348.

Continuing with the second readout 354 in FIG. 3B, the second readout 354 further includes the image charge in the SPD subpixel being configured to be transferred to the floating diffusion FD through the first transfer transistor, as indicated with the pulsing of the TX0 signal 322. Next, an image data signal value of the second readout 354 is configured to be sampled and held from the floating diffusion FD through the bitline as indicated with the "SHS3" label in ADC signal 348. At this time, the CDS value of the second readout 354 is a difference between the image data signal value ("SHS3") of the second readout 354 and the reset value ("SHR3") of the second readout 354.

It is appreciated that the third readout 356 in FIG. 3B is also substantially similar to the third readout 356 in FIG. 3A. For instance, referring specifically to the third readout 356 in FIG. 3B, the image charge in the SPD subpixel is also further configured to be transferred to the LOFIC and the floating diffusion FD through the DFD transistor and the first transfer transistor as indicated with the DFD signal 328 being enabled and the TX0 signal 322 being pulsed again as shown. Next, an image data signal value of the third readout 356 is configured to be sampled and held from the floating diffusion FD and the LOFIC through the bitline as indicated with the "SHS4" label in ADC signal 348.

Continuing with the third readout 356 in FIG. 3B, the reset signal RST 336 is pulsed again while the DFD signal 328 is still enabled such that the floating diffusion FD and the LOFIC of the pixel cell are reset. Next, the ADC 348 signal indicates that a reset value of the third readout 356 is configured to be sampled and held from the floating diffusion FD and the LOFIC through the bitline as indicated with the "SHR4" label in ADC signal 348. At this time, the CDS value of the third readout 356 is a difference between the image data signal value ("SHS4") of the third readout 356 and the reset value ("SHR4") of the third readout 356.

Figure 4A:
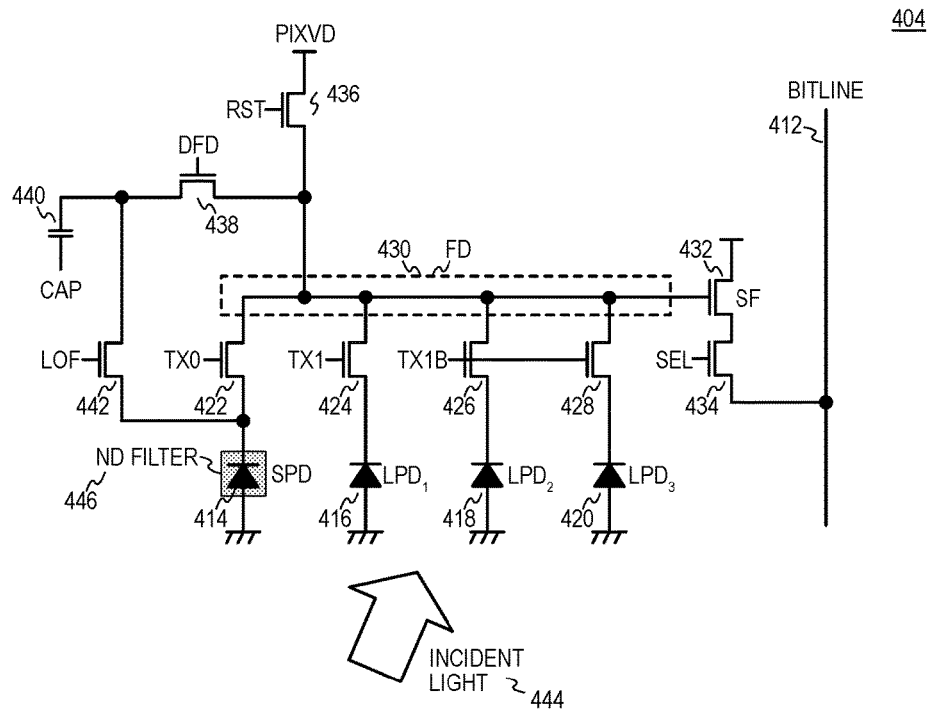
FIG. 4A illustrates another example schematic of a shared pixel cell of a CMOS image sensor in accordance with the teachings of the present disclosure.

FIG. 4A illustrates another example schematic of a shared pixel cell 404 of a CMOS image sensor in accordance with the teachings of the present disclosure. It is appreciated the example schematic of pixel cell 404 of FIG. 4A may be another example of pixel cell 204 of FIG. 2 or may be another example of the pixel cells 104 of the pixel array 102 as shown in FIG. 1, and that similarly named and numbered elements described above are coupled and function similarly below.

It is further appreciated that pixel cell 404 of FIG. 4A shares many similarities with pixel cell 204 of FIG. 2. For instance, as shown in the example depicted in FIG. 4A, pixel cell 404 also includes a plurality of subpixels that include a first subpixel, which is configured as an SPD 414, and a plurality of second subpixels, which are configured as an LPD including $LPD_1$ 416, $LPD_2$ 418, and $LPD_3$ 420 as shown. In the depicted example, pixel cell 404 also includes a floating diffusion FD 430 coupled to receive the image charge from the plurality of subpixels SPD 414, $LPD_1$ 416, $LPD_2$ 418, and $LPD_3$ 420.

The example depicted in FIG. 4A also shows a plurality of transfer transistors including a first transfer transistor 422, and a plurality of second transistors, which include transfer transistor 424, transfer transistor 426, and transfer transistor 428. In operation, the photogenerated image charge is coupled to be transferred from the first subpixel SPD 414 to the floating diffusion FD 430 through the first transfer transistor 422. The photogenerated image charge is coupled to be transferred from the plurality of second subpixels $LPD_1$ 416, $LPD_2$ 418, and $LPD_3$ 420 to the floating diffusion FD 430 through the plurality of second transfer transistors 424, 426, and 428, respectively.

In the depicted example, transfer transistor 422 is coupled to be controlled in response to transfer control signal TX0. One difference between pixel cell 404 of FIG. 4A and pixel cell 204 of FIG. 2 is that in pixel cell 404 of FIG. 4A, the transfer transistor 424 is coupled to be controlled in response to transfer control signal TX1, while the transfer transistors 426 and 428 are coupled to be controlled in response to a separate transfer control signal TX1B as shown. As will be described in further detail below, by providing separate transfer control signals TX1 and TX1B, the LPD can be read out with multiple transfers, with each transfer providing different effective gain in accordance with the teachings of the present invention. For instance, in one example, when only one subpixel $LPD_1$ 416 is read out, then the LPD is read out with an effective 1× (ADC) analog gain, while when all three subpixels $LPD_1$ 416, $LPD_2$ 418, and $LPD_3$ 420 are read out, an effective high (ADC) analog gain (e.g., $8\times_{16x}$) is provided in accordance with the teachings of the present invention.

Continuing with the example depicted in FIG. 4A, pixel cell 404 also includes an attenuation layer 446 or ND filter disposed over the first subpixel SPD 414. In one example, attenuation layer 446 has an attenuation ratio in the range of 3:1 to 32:1 (i.e., 3-32×). For instance, in one example, the attenuation layer 446 has an attenuation ratio of 5:1 (i.e., 5×), or in the range of 5:1 to 10:1 (i.e., 5-10×). In operation, the first subpixel SPD 414 is optically coupled to receive the incident light 444 through the attenuation layer 446. In the example, the plurality of second subpixels $LPD_1$ 416, $LPD_2$ 418, and $LPD_3$ 420 are not covered by attenuation layer 446 and are therefore optically coupled to receive the incident light 444 without passing through the attenuation layer 446.

In the example illustrated in FIG. 4A, a DFD transistor 438 is coupled to the floating diffusion FD 430, and a LOFIC 440, which is coupled between a CAP signal and the DFD transistor 438 as shown. In one example, a LOFIC transistor 442 is coupled between the LOFIC 440 and the subpixel SPD 414 as shown. In the example, the LOFIC transistor 442 is coupled to be controlled in response to a LOF signal.

The illustrated example shows that pixel cell 404 also includes a source follower transistor 432, which is coupled to a voltage supply and has a gate electrode that is coupled to the floating diffusion FD 430. A select transistor 434 is coupled to the source follower transistor 432 and a bitline 412, and is coupled to be controlled in response to a select signal SEL. In operation, the source follower transistor 432 is coupled to output an image data signal to the bitline 412 through select transistor 434 in response to the image charge in the floating diffusion FD 430. A reset transistor 436 is coupled between the voltage supply PIXVD and the floating diffusion FD 430 and is coupled to reset the pixel cell 404 in response to a reset control signal RST. In operation, reset transistor 436 may be configured to reset the floating diffusion FD 430, as well as reset the LOFIC 440 through the DFD transistor 438.

Figure 4B:
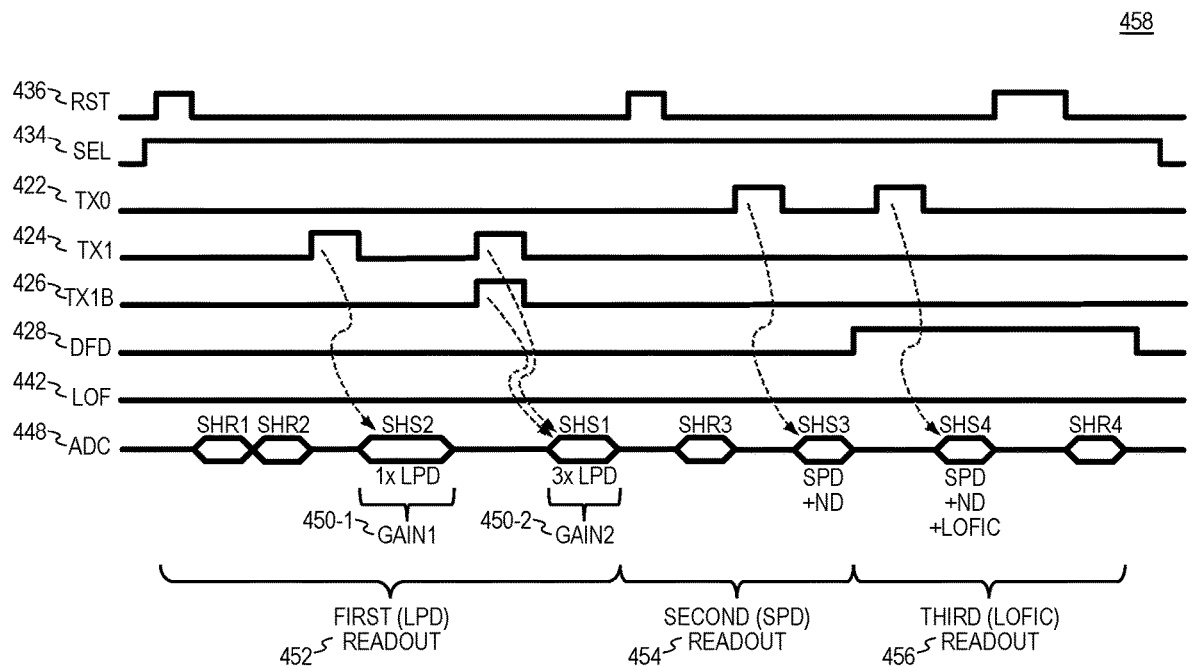
FIG. 4B illustrates yet another example timing diagram of signals found in an example shared pixel cell during readout of a CMOS image sensor in accordance with the teachings of the present disclosure.

FIG. 4B illustrates yet another example timing diagram 458 of signals found in an example shared pixel cell of a CMOS image sensor in accordance with the teachings of the present disclosure. It is appreciated the signals illustrated in example timing diagram 458 of FIG. 4B may be examples of signals found in the schematic of pixel cell 404 of FIG. 4A or of signals found in the pixel cells 104 of the pixel array 102 as shown in FIG. 1, and that similarly named and numbered elements described above are coupled and function similarly below.

It is further appreciated that timing diagram 458 of FIG. 4B shares many similarities with timing diagram 358B of FIG. 3B. One difference between timing diagram 458 of FIG. 4B and timing diagram 358B of FIG. 3B is that timing diagram 458 of FIG. 4B also includes a TX1B 426 signal, which controls the transfer transistors 426 and 428 in pixel cell 404 separately from the control of transfer transistor 424 by the TX1 424 signal. As will be shown, another difference between timing diagram 458 of FIG. 4B and timing diagram 358B of FIG. 3B is that the two different gain readouts 450-1 and 450-2 in timing diagram 458 of FIG. 4B are realized by transferring the image charge via only a TX1 424 pulse in the first gain readout 450-1, and then via TX1 424 and TX1B 426 pulses in the second gain readout 450-1 as shown.

To illustrate, referring specifically to the first readout 452 of the example timing diagram 458 of FIG. 4B, the select signal SEL 434 is activated and the reset signal RST 436 is pulsed. At this time the floating diffusion FD of the pixel cell is reset. Next, two reset values are sampled and held. In particular, ADC 448 signal indicates that a first reset value of the first readout 452 is sampled and held from the floating diffusion FD through the bitline as indicated with the "SHR1" label in ADC signal 448, and a second reset value of the first readout 452 is sampled and held from the floating diffusion FD through the bitline as indicated with the "SHR2" label in ADC signal 448.

Continuing with the first readout 452 in FIG. 4B, the first gain readout 450-1 of the first readout 452 includes the image charge in only the $LPD_1$ subpixel being configured to be transferred to the floating diffusion FD through the respective second transfer transistor (e.g., transfer transistor 424 in FIG. 4A), as indicated with the pulsing of the TX1 424 signaling FIG. 4B. Next, the ADC 448 signal indicates that an image data signal value of the first gain readout 450-1 is configured to be sampled and held from the floating diffusion FD through the bitline with an effective first gain setting (e.g., "GAIN1") since only one $LPD_1$ subpixel is read out. At this time, the CDS value of the first gain readout 450-1 of the LPD readout of the first readout 452 is a difference between the image data signal value of the first gain readout (e.g., "SHS2") and one of the two reset values (e.g., "SHR2") of the of the first readout 452.

Next, a second gain readout 450-2 of the first readout 452 includes the image charge in all of the $LPD_1$, $LPD_2$, and $LPD_3$ subpixels being configured to be transferred to the floating diffusion FD again through the second transfer transistors, as indicated with the pulsing of the TX1 424 signal again as well as the pulsing of the TX1B 426 signal as shown. Next, the ADC 448 signal indicates that an image data signal value of the second gain readout 450-2 is configured to be sampled and held from the floating diffusion FD through the bitline with an effective second gain setting (e.g., "GAIN2") since all three of the LPD$_1$, LPD$_2$, and LPD$_3$ subpixels are read out. At this time, the CDS value of the second gain readout 450-2 of the LPD readout of the second readout 452 is a difference between the image data signal value of the second gain readout (e.g., "SHS1") and the other one of the two reset values (e.g., "SHR1") of the of the second readout 452.

It is appreciated that the second readout 454 in FIG. 4B is substantially similar to the second readout 354 in FIG. 3B as well as the second readout 354 in FIG. 3A. For instance, referring specifically to the second readout 454 in FIG. 4B, the reset signal RST 436 is pulsed again such that the floating diffusion FD of the pixel cell is reset. Next, the ADC 448 signal indicates that a reset value of the second readout 454 is sampled and held from the floating diffusion FD through the bitline as indicated with the "SHR3" label in ADC signal 448.

Continuing with the second readout 454 in FIG. 4B, the second readout 454 further includes the image charge in the SPD subpixel being configured to be transferred to the floating diffusion FD through the first transfer transistor, as indicated with the pulsing of the TX0 signal 422. Next, an image data signal value of the second readout 454 is configured to be sampled and held from the floating diffusion FD through the bitline as indicated with the "SHS3" label in ADC signal 448. At this time, the CDS value of the second readout 454 is a difference between the image data signal value ("SHS3") of the second readout 454 and the reset value ("SHR3") of the second readout 454.

It is appreciated that the third readout 456 in FIG. 4B is also substantially similar to the third readout 356 in FIG. 3B as well as the third readout 356 in FIG. 3A. For instance, referring specifically to the third readout 456 in FIG. 4B, the image charge in the SPD subpixel is also further configured to be transferred to the LOFIC and the floating diffusion FD through the DFD transistor and the first transfer transistor as indicated with the DFD signal 428 being enabled and the TX0 signal 422 being pulsed again as shown. Next, an image data signal value of the third readout 456 is configured to be sampled and held from the floating diffusion FD and the LOFIC through the bitline as indicated with the "SHS4" label in ADC signal 448.

Continuing with the third readout 456 in FIG. 4B, the reset signal RST 436 is pulsed again while the DFD signal 428 is still enabled such that the floating diffusion FD and the LOFIC of the pixel cell are reset. Next, the ADC 448 signal indicates that a reset value of the third readout 456 is configured to be sampled and held from the floating diffusion FD and the LOFIC through the bitline as indicated with the "SHR4" label in ADC signal 448. At this time, the CDS value of the third readout 456 is a difference between the image data signal value ("SHS4") of the third readout 456 and the reset value ("SHR4") of the third readout 456.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
  a plurality of subpixels, wherein each one of the plurality of subpixels includes a photodiode configured to photogenerate image charge in response to incident light, wherein the plurality of subpixels includes a first subpixel and a plurality of second subpixels;
  a floating diffusion coupled to receive the image charge from the plurality of subpixels;
  a plurality of transfer transistors including a first transfer transistor and a plurality of second transistors, wherein the image charge is coupled to be transferred from the first subpixel to the floating diffusion through first transfer transistor, wherein the image charge is coupled to be transferred from the plurality of second subpixels to the floating diffusion through the plurality of second transfer transistors;
  an attenuation layer disposed over the first subpixel, wherein the first subpixel is optically coupled to receive the incident light through the attenuation layer, wherein the plurality of second subpixels is optically coupled to receive the incident light without passing through the attenuation layer;
  a dual floating diffusion (DFD) transistor coupled to the floating diffusion; and
  a capacitor coupled to the DFD transistor.

2. The pixel cell of claim 1, further comprising:
  a source follower transistor coupled to a voltage supply and having a gate coupled to the floating diffusion; and
  a select transistor coupled to the source follower transistor and a bitline, wherein the source follower transistor is coupled to output an image data signal to the bitline in response to the image charge in the floating diffusion.

3. The pixel cell of claim 2, further comprising a reset transistor coupled between the voltage supply and the floating diffusion.

4. The pixel cell of claim 3,
  wherein a first readout of the image data signal from the pixel cell is configured to be obtained from the second plurality of subpixels through the bitline, wherein the first readout of the image data signal includes image data in the incident light at a lower illumination intensity range,
  wherein a second readout of the image data signal from the pixel cell is then configured to be obtained from the first subpixel through the bitline, wherein the second readout of the image data signal includes image data in the incident light at a medium illumination intensity range, and
  wherein a third readout of the image data signal from the pixel cell is then configured to be obtained from the capacitor and the first subpixel through the bitline, wherein the third readout of the image data signal includes image data in the incident light at a higher illumination intensity range.

5. The pixel cell of claim 4, wherein the first readout of the image data signal includes the floating diffusion being configured to be reset through the reset transistor, and then a first reset value of the first readout being configured to be sampled and held from the floating diffusion through the bitline.

6. The pixel cell of claim 5, wherein the first readout of the image data signal further includes the image charge in the plurality of second subpixels being configured to be transferred to the floating diffusion through the plurality of second transfer transistors, and then a first image data signal value of the first readout being configured to be sampled and held from the floating diffusion through the bitline, wherein the first readout is a difference between the first image data signal value of the first readout and the first reset value of the first readout.

7. The pixel cell of claim 5, wherein the first readout of the image data signal further includes a second reset value of the first readout being configured to be sampled and held from the floating diffusion through the bitline.

8. The pixel cell of claim 7, wherein the first readout of the image data signal includes a first gain readout and a second gain readout.

9. The pixel cell of claim 8, wherein the first gain readout includes the image charge in the plurality of second subpixels being configured to be transferred to the floating diffusion through the plurality of second transfer transistors, and then an image data signal value of the first gain readout being configured to be sampled and held from the floating diffusion through the bitline by an analog-to-digital converter (ADC) at a first gain setting coupled to the bitline, wherein the first gain readout is a difference between the image data signal value of the first gain readout and the first reset value of the first readout,
wherein the second gain readout includes the image charge in the plurality of second subpixels being configured to be transferred to the floating diffusion through the plurality of second transfer transistors, and then an image data signal value of the second gain readout being configured to be sampled and held from the floating diffusion through the bitline by the ADC at a second gain setting coupled to the bitline, wherein the second gain readout is a difference between the image data signal value of the second gain readout and the second reset value of the first readout.

10. The pixel cell of claim 8, wherein the first gain readout includes the image charge in one of the subpixels of the plurality of second subpixels being configured to be transferred to the floating diffusion through one of the plurality of second transfer transistors, and then an image data signal value of the first gain readout being configured to be sampled and held from the floating diffusion through the bitline, wherein the first gain readout is a difference between the image data signal value of the first gain readout and the first reset value of the first readout,
wherein the second gain readout includes the image charge in remaining subpixels of the plurality of second subpixels being configured to be transferred to the floating diffusion through remaining second transfer transistors the plurality of second transfer transistors, and then an image data signal value of the second gain readout being configured to be sampled and held from the floating diffusion through the bitline, wherein the second gain readout is a difference between the image data signal value of the second gain readout and the second reset value of the first readout.

11. The pixel cell of claim 4, wherein the second readout of the image data signal includes the floating diffusion being configured to be reset through the reset transistor, and then a reset value of the second readout is configured to be sampled and held from the floating diffusion through the bitline.

12. The pixel cell of claim 11, wherein the second readout of the image data signal further includes the image charge in the first subpixel being configured to be transferred to the floating diffusion through the first transfer transistor, and then an image data signal value of the second readout being configured to be sampled and held from the floating diffusion through the bitline, wherein the second readout is a difference between the image data signal value of the second readout and the reset value of the second readout.

13. The pixel cell of claim 4, wherein the third readout of the image data signal includes the image charge in the first subpixel being configured to be transferred to the capacitor and the floating diffusion through the DFD transistor and the first transfer transistor, and then an image data signal value of the third readout being configured to be sampled and held from the floating diffusion and the capacitor through the bitline.

14. The pixel cell of claim 13, wherein the third readout of the image data signal further includes the floating diffusion and the capacitor being configured to be reset through the reset transistor and the DFD transistor, and then a reset value of the third readout being configured to be sampled and held from the floating diffusion and the capacitor through the bitline, wherein the third readout is a difference between the image data signal value or the third readout and the reset value of the third readout.

15. The pixel cell of claim 1, wherein the capacitor is a lateral overflow integration capacitor (LOFIC).

16. The pixel cell of claim 15, further comprising a LOFIC transistor coupled between the LOFIC and the first subpixel.

17. The pixel cell of claim 15, wherein the LOFIC has a capacitance of approximately 64 fF.

18. The pixel cell of claim 1, wherein the attenuation layer has an attenuation ratio in a range of approximately 3:1 to 32:1.

19. An imaging system, comprising:
a pixel array including a plurality of pixel cells arranged in rows and columns, wherein each one of the pixel cells is coupled to generate an image data signal in response to incident light, wherein each one of the pixel cells comprises:
a plurality of subpixels, wherein each one of the plurality of subpixels includes a photodiode configured to photogenerate image charge in response to incident light, wherein the plurality of subpixels includes a first subpixel and a plurality of second subpixels;
a floating diffusion coupled to receive the image charge from the plurality of subpixels;
a plurality of transfer transistors including a first transfer transistor and a plurality of second transistors, wherein the image charge is coupled to be transferred from the first subpixel to the floating diffusion through first transfer transistor, wherein the image charge is coupled to be transferred from the plurality of second subpixels to the floating diffusion through the plurality of second transfer transistors;
a neutral density filter covering over the first subpixel, wherein the first subpixel is optically coupled to receive the incident light through the neutral density filter, wherein the plurality of second subpixels is not covered by the neutral density filter;
a dual floating diffusion (DFD) transistor coupled to the floating diffusion; and
a lateral overflow integration capacitor (LOFIC) coupled to the DFD transistor;
a control circuitry coupled to the pixel array to control operation of the pixel array; and
a readout circuitry coupled to the pixel array to read out image data from the pixel array through bitlines.

20. The imaging system of claim 19, further comprising function logic coupled to the readout circuitry to store the image data read out from the pixel array.

21. The imaging system of claim 19, wherein each one of the pixel cells further comprises:
a source follower transistor coupled to a voltage supply and having a gate coupled to the floating diffusion; and
a select transistor coupled to the source follower transistor and a bitline, wherein the source follower transistor is coupled to output the image data signal to the bitline in response to the image charge in the floating diffusion.

22. The imaging system of claim 21, wherein each one of the pixel cells further comprises a reset transistor coupled between the voltage supply and the floating diffusion.

23. The imaging system of claim 22,
wherein a first readout of the image data signal from each one of the pixel cells is representative of a large photodiode (LPD) readout,
wherein a second readout of the image data signal from each one of the pixel cells is representative of a small photodiode (SPD) readout, and
wherein a third readout of the image data signal from each one of the pixel cells is representative of a LOFIC readout.

24. The imaging system of claim 23,
wherein the LPD readout is configured to be obtained from the second plurality of subpixels through the bitline, wherein the LPD readout of the image data signal includes image data in the incident light at a lower illumination intensity range,
wherein the SPD readout is then configured to be obtained from the first subpixel through the bitline, wherein the second readout of the image data signal includes image data in the incident light at a medium illumination intensity range, and
wherein the LOFIC readout is then configured to be obtained from the capacitor and the first subpixel through the bitline, wherein the third readout of the image data signal includes image data in the incident light at a higher illumination intensity range.

25. The imaging system of claim 24, wherein the LPD readout includes the floating diffusion being configured to be reset through the reset transistor, and then a first reset value of the LPD readout being configured to be sampled and held from the floating diffusion through the bitline.

26. The imaging system of claim 25, wherein the LPD readout further includes the image charge in the plurality of second subpixels being configured to be transferred to the floating diffusion through the plurality of second transfer transistors, and then a first image data signal value of the LPD readout being configured to be sampled and held from the floating diffusion through the bitline, wherein the LPD readout is a difference between the first image data signal value of the LPD readout and the first reset value of the LPD readout.

27. The imaging system of claim 25, wherein the LPD readout of the image data signal further includes a second reset value of the LPD readout being configured to be sampled and held from the floating diffusion through the bitline.

28. The imaging system of claim 27, wherein the LPD readout of the image data signal includes a first gain readout and a second gain readout.

29. The imaging system of claim 28, wherein the first gain readout includes the image charge in the plurality of second subpixels being configured to be transferred to the floating diffusion through the plurality of second transfer transistors, and then an image data signal value of the first gain readout being configured to be sampled and held from the floating diffusion through the bitline by an analog-to-digital converter (ADC) at a first gain setting coupled to the bitline in the readout circuitry, wherein the first gain readout is a difference between the image data signal value of the first gain readout and the first reset value of the LPD readout,
wherein the second gain readout includes the image charge in the plurality of second subpixels being configured to be transferred to the floating diffusion through the plurality of second transfer transistors, and then an image data signal value of the second gain readout being configured to be sampled and held from the floating diffusion through the bitline by the ADC at a second gain setting coupled to the bitline in the readout circuitry, wherein the second gain readout is a difference between the image data signal value of the second gain readout and the second reset value of the LPD readout.

30. The pixel cell of claim 28, wherein the first gain readout includes the image charge in one of the subpixels of the plurality of second subpixels being configured to be transferred to the floating diffusion through one of the plurality of second transfer transistors, and then an image data signal value of the first gain readout being configured to be sampled and held from the floating diffusion through the bitline, wherein the first gain readout is a difference between the image data signal value of the first gain readout and the first reset value of the LPD readout,
wherein the second gain readout includes the image charge in remaining subpixels of the plurality of second subpixels being configured to be transferred to the floating diffusion through remaining second transfer transistors the plurality of second transfer transistors, and then an image data signal value of the second gain readout being configured to be sampled and held from the floating diffusion through the bitline, wherein the second gain readout is a difference between the image data signal value of the second gain readout and the second reset value of the LPD readout.

31. The imaging system of claim 24, wherein the SPD readout includes the floating diffusion being configured to be reset through the reset transistor, and then a reset value of the SPD readout is configured to be sampled and held from the floating diffusion through the bitline.

32. The imaging system of claim 31, wherein the SPD readout further includes the image charge in the first subpixel being configured to be transferred to the floating diffusion through the first transfer transistor, and then an image data signal value of the SPD readout being configured to be sampled and held from the floating diffusion through the bitline, wherein the SPD readout is a difference between the image data signal value of the SPD readout and the reset value of the SPD readout.

33. The imaging system of claim 24, wherein the LOFIC readout includes the image charge in the first subpixel being configured to be transferred to the LOFIC and the floating diffusion through the DFD transistor and the first transfer transistor, and then an image data signal value of the LOFIC readout being configured to be sampled and held from the floating diffusion and the LOFIC through the bitline.

34. The imaging system of claim 33, wherein the LOFIC readout further includes the floating diffusion and the LOFIC being configured to be reset through the reset transistor and the DFD transistor, and then a reset value of the LOFIC readout being configured to be sampled and held from the floating diffusion and the LOFIC through the bitline, wherein the LOFIC readout is a difference between the image data signal value or the LOFIC readout and the reset value of the LOFIC readout.

35. The imaging system of claim 19, wherein each one of the pixel cells further comprises a LOFIC transistor coupled between the LOFIC and the first subpixel.

* * * * *